United States Patent
Tsai

(10) Patent No.: US 12,363,834 B2
(45) Date of Patent: Jul. 15, 2025

(54) CIRCUIT BOARD MODULE AND MANUFACTURING METHOD THEREOF

(71) Applicant: LEOTEK CORPORATION, Taipei (TW)

(72) Inventor: Cheng-Ta Tsai, Taipei (TW)

(73) Assignee: LEOTEK CORPORATION, Taipei (TW)

( * ) Notice: Subject to any disclaimer, the term of this patent is extended or adjusted under 35 U.S.C. 154(b) by 301 days.

(21) Appl. No.: 18/134,482

(22) Filed: Apr. 13, 2023

(65) Prior Publication Data

US 2024/0276652 A1      Aug. 15, 2024

(30) Foreign Application Priority Data

Feb. 13, 2023   (TW) ................................. 112104973

(51) Int. Cl.
*H05K 1/14* (2006.01)
*H05K 3/36* (2006.01)
*H05K 3/46* (2006.01)

(52) U.S. Cl.
CPC ........... *H05K 3/361* (2013.01); *H05K 3/4611* (2013.01); *H05K 1/147* (2013.01); *H05K 2201/04* (2013.01); *H05K 2203/06* (2013.01)

(58) Field of Classification Search
CPC .... H05K 3/4623; H05K 3/4602; H05K 1/147; H05K 1/148
See application file for complete search history.

(56) References Cited

U.S. PATENT DOCUMENTS

| | | | |
|---|---|---|---|
| 7,371,970 B2 | 5/2008 | Flammer et al. | |
| 2022/0071010 A1* | 3/2022 | Tseng | H01L 23/49822 |

FOREIGN PATENT DOCUMENTS

| | | |
|---|---|---|
| CN | 101861057 A | 10/2010 |
| CN | 203407082 U | 1/2014 |
| TW | 200624010 A | 7/2006 |
| TW | I739160 B | 9/2021 |

OTHER PUBLICATIONS

Taiwan office Action issued by the TIPO on Sep. 5, 2023 for application No. 112104973, 9 pages.

\* cited by examiner

*Primary Examiner* — Jeremy C Norris
(74) *Attorney, Agent, or Firm* — Innovation Counsel LLP

(57) ABSTRACT

A circuit board module includes a first circuit board, a second circuit board and a connection layer. The first circuit board includes two first conductive layers, a first dielectric core layer and a first conductive via, the first dielectric core layer is formed between the two first conductive layers, and the first conductive via connects the two first conductive layers. The second circuit board includes two second conductive layers, a second dielectric core layer and a second conductive via, the second dielectric core layer is formed between the two second conductive layers, and the second conductive via connect the two second conductive layers. The connection layer is formed between the first circuit board and the second circuit board and combines the first circuit board with the second circuit board. The second circuit board is disposed on a side of the first circuit board.

20 Claims, 8 Drawing Sheets

CIRCUIT BOARD MODULE AND MANUFACTURING METHOD THEREOF

This application claims the benefit of Taiwan application Serial No. 112104973, filed Feb. 13, 2023, the subject matter of which is incorporated herein by reference.

FIELD OF THE INVENTION

The invention relates to a circuit board module and a manufacturing method thereof.

BACKGROUND OF THE INVENTION

Based on the demand for high-speed transmission of a large amount of data, a high-frequency product is developed to come out. The high-frequency signal on the circuit board passes through multiple conductive holes, which may cause stub effects, and then generate reflected waves to affect signal integrity. Therefore, there is a need to propose a new circuit board module to improve the aforementioned conventional problems.

SUMMARY OF THE INVENTION

In an embodiment of the invention, a circuit board module is provided. The circuit board module includes a first circuit board, a second circuit board and a first connection layer. The first circuit board includes two first conductive layers, a first dielectric core layer and a first conductive hole, wherein the first dielectric core layer is formed between the two first conductive layers, and the first conductive hole connects the two first conductive layers. The second circuit board includes two second conductive layers, a second dielectric core layer and a second conductive hole, wherein the second dielectric core layer is formed between the two second conductive layers, and the second conductive hole connects the two second conductive layers. The first connection layer is formed between the first circuit board and the second circuit board and combining the first circuit board with the second circuit board. The second circuit board is disposed on a first surface of the first circuit board.

In another embodiment of the invention, a manufacturing method for a circuit board module is provided. The manufacturing method further includes the following steps: providing a first circuit board, wherein the first circuit board includes two first conductive layers, a first dielectric core layer and a first conductive hole, the first dielectric core layer is formed between the two first conductive layers, and the first conductive hole connects the two first conductive layers; providing a second circuit board, wherein the second circuit board includes two second conductive layers, a second dielectric core layer and a second conductive hole, the second dielectric core layer is formed between the two second conductive layers, and the second conductive hole connects the two second conductive layers; disposing a first prepreg connection layer between the first circuit board and the second circuit board, wherein the second circuit board is disposed on a first surface of the first circuit board; and pressing and heating the first circuit board, the first prepreg connection layer and the second circuit board to form the circuit board module, wherein the first prepreg connection layer is cured to form a first connection layer after being heated.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
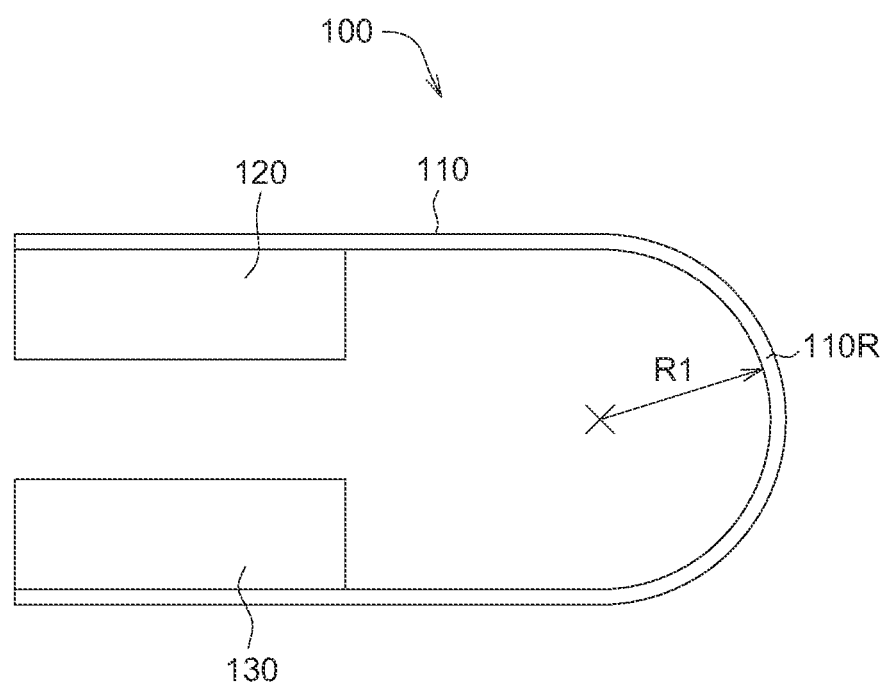
FIG. 1 shows a schematic diagram of a circuit board module according to an embodiment of the present invention.
Figure 2:
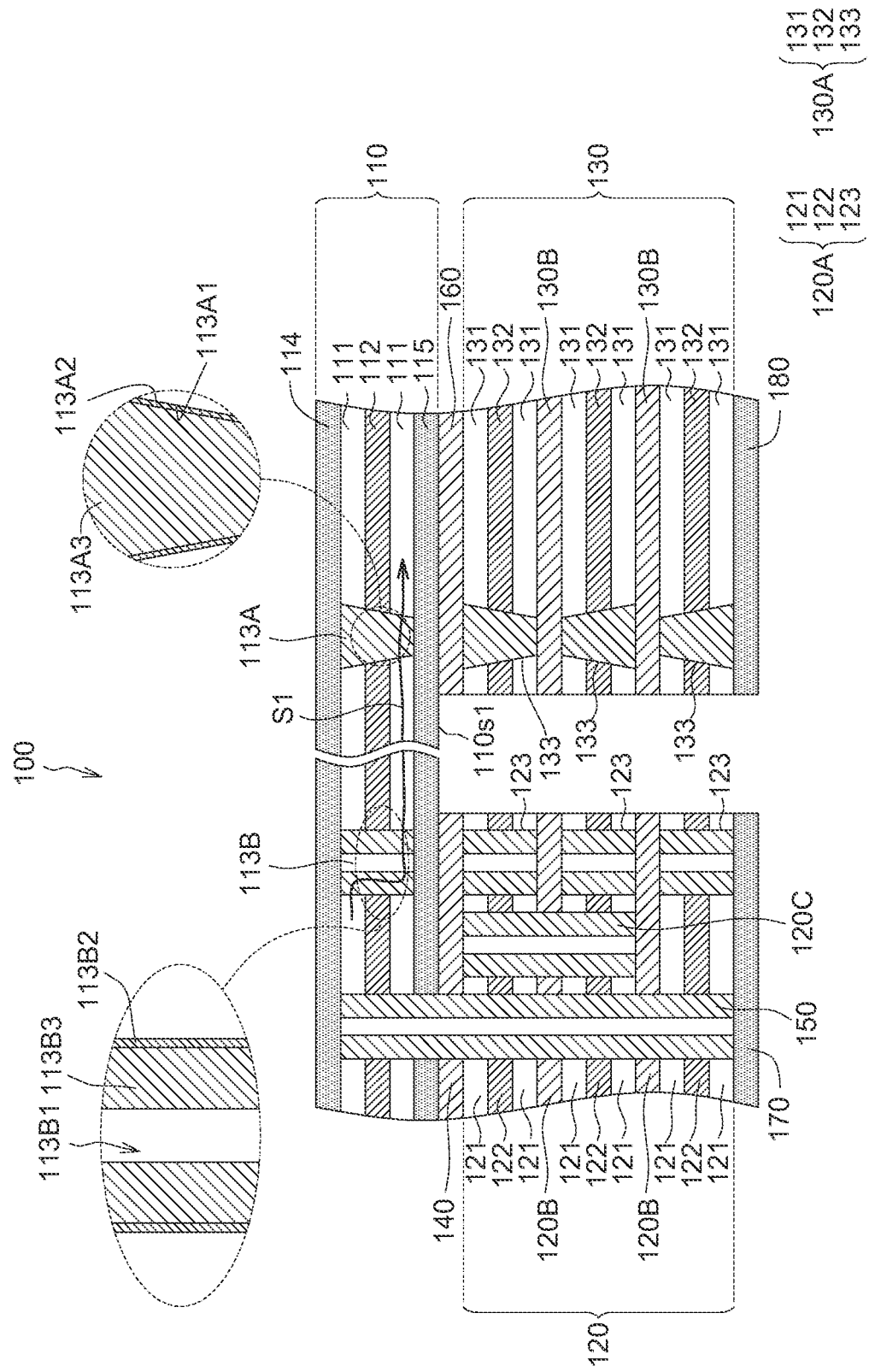
FIG. 2 shows a schematic diagram of a partial cross-sectional view of the circuit board module in FIG. 1.

Refer to FIGS. 1 to 2, FIG. 1 shows a schematic diagram of a circuit board module 100 according to an embodiment of the present invention, and FIG. 2 shows a schematic diagram of a partial cross-sectional view of the circuit board module 100 in FIG. 1.

As shown in FIGS. 1 and 2, the circuit board module 100 includes a first circuit board 110, a second circuit board 120, a third circuit board 130, a first connection layer 140, at least one first connection hole 150, a third connection layer 160, a third protection layer 170 and a fourth protection layer 180. The circuit board module 100 could be applied to an electronic product, such as a lamp (for example, a street lamp, a traffic lamp, etc.), an automobile, a home appliance, a mobile phone, a notebook computer, etc., but not limited to the aforementioned devices. For a street lamp, one of the second circuit board 120 and the third circuit board 130 is, for example, a power supply board, a lamp board or a control board. The first circuit board 110 could connect the second circuit board 120 with the third circuit board 130 for electrically connecting the second circuit board 120 with the third circuit board 130.

As shown in FIG. 2, the first circuit board 110 includes at least two first conductive layers 111, at least one first dielectric core layer (core) 112, at least one first conductive hole (for example, a laser via 113A and a drilling via 113B), a first protection layer 114 and a second protection layer 115. The first dielectric core layer 112 is formed between the two first conductive layers 111 to form at least one first circuit board assembly, wherein the laser via 113A and/or the drilling via 113B penetrates the first circuit board assembly, or connects two first conductive layers 111 of the first circuit board assembly. The "connection of two elements through a hole" herein means, for example, a through connection or a non-through connection, so that the "hole" could be a blind hole or a through hole.

Although not shown, the "conductive layer" herein is, for example, a patterned conductive layer, which could include at least one trace and/or at least one pad, wherein the trace is electrically connected to the pad, and the trace could be transmit signal in an electronic component (not shown) disposed on the circuit board.

As shown in FIG. 2, the laser vias 113A and the drilling vias 113B are formed by, for example, different processes, and have different structures. For example, the laser via 113A includes a connection hole 113A1, an electroless copper layer 113A2 and an electroplated copper layer 113A3, wherein the connection hole 113A1 is formed by laser drilling technology, the electroless copper 113A2 is formed on a hole wall of connection hole 113A1, and the electroplated copper 113A3 within formed on the electroless copper 113A2 and fills up the connection hole 113A1. The drilling via 113B includes a connection hole 113B1, an electroless copper layer 113B2 and an electroplated copper layer 113B3, wherein the connection hole 113B1 is formed by mechanical drilling technology, the electroless copper layer 113B2 is formed on an hole wall of the connection hole 113B1, and the electroplated copper layer 113B3 is formed within the electroless copper layer 113B2 but does not fills up the connecting hole 113B1.

As shown in FIG. 2, the first protection layer 114 is formed on one of the two first conductive layers 111, and the second protection layer 115 is formed on the other of the two first conductive layers 111. In an embodiment, the first protection layer 114 and/or the second protection layer 115 is, for example, a solder mask.

As shown in FIG. 2, the second circuit board 120 is disposed on a first surface 110$s1$ of the first circuit board 110. As a result, a transmission path of a high-frequency signal S1 could be limited within the first circuit board 110, and accordingly a transmission loss of the high-frequency signal S1 could be reduced or even avoided. In addition, due to the transmission path of the high-frequency signal S1 being limited within the first circuit board 110, the number of the conductive holes through which the transmission passes is less (compared with the signal transmission path further passing through the second circuit board 120 and/or the third circuit board 130), the complexity of impedance matching could be reduced, and the stub effect could be reduced to maintain signal integrity. As a result, the circuit board module 100 of the embodiment of the present invention is much suitable for a high-frequency product, such as a product applying 5th generation mobile networks (5G) or a product applying a millimeter wave.

As shown in FIG. 2, in an embodiment, due to the transmission path of the high-frequency signal S1 only passing through the first circuit board 110, the first dielectric core layer 112 in the first circuit board 110 could be formed of a material suitable for the high frequency, such as a material having a low dielectric coefficient (DK), a low signal loss value (DF), a high material expansion and contraction point (TG) and/or a low thermal expansion coefficient (CTE). Furthermore, the material suitable for the high frequency includes, for example, polyimide (PI), modified polyimide (MPI), liquid crystal polymer (LCP) and/or fluorine-based materials, etc. The dielectric core layer of second circuit board 120 and/or the dielectric core layer of the third circuit board 130 could not use high-frequency materials. As a result, it could simply the management procedure of high-frequency dielectric material. For example, the stock preparation for the high-frequency dielectric material could be reduced.

As shown in FIG. 2, the second circuit board 120 includes at least one second circuit board assembly 120A, at least one second connection layer 120B and at least one second connection hole 120C. The second circuit board assembly 120A includes at least two second conductive layers 121, at least one second dielectric core layer 122 and at least one second conductive hole 123, wherein the second dielectric core layer 122 is formed on two adjacent second conductive layers 121, and the second conductive hole 123 connects the two second conductive layers 121.

In terms of materials, the second dielectric core layer 122 of the second circuit board 120 could be formed of a material selected from FR4, Teflon (PTFE), ceramics and the like. In terms of thickness, the first dielectric core layer 112 of the first circuit board 110 has a thickness ranging, for example, between 50 micrometers and 100 micrometers, such as 50 micrometers, 75 micrometers, 100 micrometers, thicker or thinner. The first conductive layer 111 has a thickness ranging, for example, between 12 micrometers and 36 micrometers, such as 12 micrometers, 18 micrometers, 36 micrometers, thicker or thinner. In addition, the second conductive layer 121 of the second circuit board 120 has a thickness ranging, for example, between 75 micrometers and 100 micrometers, such as 75 micrometers, 100 micrometers, thicker or thinner. The second dielectric core layer 122 has a thickness ranging, for example, between 18 micrometers and 36 micrometers, for example, 18 micrometers, 36 micrometers, thicker or thinner.

As shown in FIG. 2, in the second circuit board 120, the material, structure and/or manufacturing process of the second conductive hole 123 could be similar to or the same as that of the aforementioned laser via 113B or drilling via 113A, and it will not be repeated here. The second connection layer 120B is formed between two adjacent second circuit board assemblies 120A and combined (or bonded) with the two adjacent second circuit board assemblies 120A. The "connection layer" herein is, for example, a prepreg layer, but the embodiments of the present invention are not limited thereto. The second connection hole 120C is connected to at least two second circuit board assemblies 120A of the second circuit board 120. For example, the second connection hole 120C connects one of two second conductive layers 121 of one of the second circuit board assemblies 120A with one of the second conductive layer 121 of another of the second circuit board assemblies 120A. The manufacturing process of the second connection hole 120C is similar to or the same as that of the aforementioned drilling via 113B, and it will not be repeated here.

As shown in FIG. 2, the third circuit board 130 is disposed on a first surface 110$s1$ of the first circuit board 110. As a result, the transmission path of a high-frequency signal S1 could be limited within the first circuit board 110, and accordingly the transmission loss of the high-frequency signal S1 could be reduced or even avoided. In addition, due to the transmission path of the high-frequency signal S1 being limited within the first circuit board 110, the number of the conductive holes through which the transmission passes is less (compared with the signal transmission path further passing through the second circuit board 120 and/or the third circuit board 130), the complexity of impedance matching could be reduced, and the stub effect could be reduced to maintain signal integrity. As a result, the circuit board module 100 of the embodiment of the present invention is much suitable for a high-frequency product, such as a product applying 5th generation mobile networks (5G) or a product applying a millimeter wave.

In summary, as shown in FIGS. 1 and 2, the whole of the second circuit board 120 and the whole of the entire third circuit board 130 could be disposed on the same side of the first circuit board 110. Compared with the second circuit board 120 and the third circuit board 130 clamping the first circuit board, due to the whole of the second circuit board 120 and the whole of the third circuit board 130 in FIG. 1 being disposed on the same side of the first circuit board 110, a curvature radius R1 of the first circuit board 110 at a bend 110R is relatively large, and it could reduce a stress concentration at the bend 110R. In addition, due to the entire second circuit board 120 and the entire third circuit board 130 being disposed on the same side of the first circuit board 110, the expansion and contraction ratio of the second circuit board 120 and/or the expansion and contraction ratio of the third circuit board 130 is relatively small. (compared with the second circuit board 120 and the third circuit board 130 clamping the first circuit board).

As shown in FIG. 2, the third circuit board 130 includes at least one third circuit board assembly 130A and at least one fourth connection layer 130B, wherein the third circuit board assembly 130A includes two third conductive layers 131, a third dielectric core layer 132 and at least one third conductive hole 133. The third dielectric core layer 132 is formed between two third conductive layers 131, and the third conductive hole 133 connects two third conductive layers 131. The material, structure and/or manufacturing process of the third conductive hole 133 could be similar to or the same as that of the aforementioned laser via 113A or drilling via 113B, and it will not be repeated here.

As shown in FIG. 2, the fourth connection layer 130B could be formed between two adjacent third circuit board assemblies 130A and combined with the adjacent two third circuit board assemblies 130A.

Although not shown, the third circuit board 130 could further include at least one conductive hole similar to the aforementioned second connection hole 120C to connect at least two third circuit board assemblies 130A of the third circuit board 130. For example, the conductive hole connects one of two third conductive layers 131 of one of the third circuit board assemblies 130A with one of two third conductive layers 131 of another of the third circuit board assemblies 130A.

The aforementioned third circuit board 130 and/or the second circuit board 120 are, for example, printed circuit boards (PCB) which may be called hard boards (with low flexibility), while the first circuit board 110 is, for example, a flexible printed circuit (FPC) which may be called a soft board (with high flexibility). For example, the material of the first dielectric core layer 112 of the first circuit board 110 could not contain glass fiber cloth, which is conducive to flexibility. However, there is no such limitation to the second circuit board 120.

Furthermore, the second dielectric core layer 122 of the first circuit board 120 may include glass fiber cloth. In order to obtain the flexibility of the first circuit board 110, the first circuit board 110 does not consider the use of electrolytic copper. For example, the rolled copper could be used; however, there is no such limitation to the second circuit board 120. For example, the conductive layer 121 of the first circuit board 120 could be rolled copper or electrolytic copper. The structure and/or material of the third circuit board 130 could be similar to or the same as that of the second circuit board 120, and it will not be repeated here.

As shown in FIG. 2, the first connection layer 140 is formed between the first circuit board 110 and the second circuit board 120 and combines the first circuit board 110 and the second circuit board 120.

As shown in FIG. 2, the first connection hole 150 could connect the first circuit board 110 and the second circuit board 120. For example, the first connection hole 150 connects one of the two first conductive layers 111 of the first circuit board 110 with one of the two second conductive layers 121 of one second circuit board assembly 120A of the second circuit board 120. Although not shown, the circuit board module 100 could further include at least one third connection hole which connects the first circuit board 110 with the third circuit board 130, for example, connects one of two first conductive layers 111 of the first circuit board 110 with one of two third conductive layers 131 of one third circuit board assembly 130A of the third circuit board 130. The aforementioned third connection hole has a structure similar to that of the aforementioned first connection hole 150, and it will not be repeated here.

As shown in FIG. 2, the third connection layer 160 is formed between the first circuit board 110 and the third circuit board 130 and combines the first circuit board 110 with the third circuit board 130.

As shown in FIG. 2, the third protection layer 170 is formed on the outermost second circuit board assembly 120A. For example, the third protection layer 170 covers the outermost second conductive layer 121 of the outermost second circuit board assembly 120A to protect the second conductive layer 121. The third protection layer 170 is, for example, solder mask.

As shown in FIG. 2, the fourth protection layer 180 is formed on the outermost third circuit board assembly 130A. For example, the fourth protection layer 180 covers the outermost third conductive layer 131 of the outermost third circuit board assembly 130A to protect the third conductive layer 131. The fourth protection layer 180 is, for example, solder mask.

Figure 3:
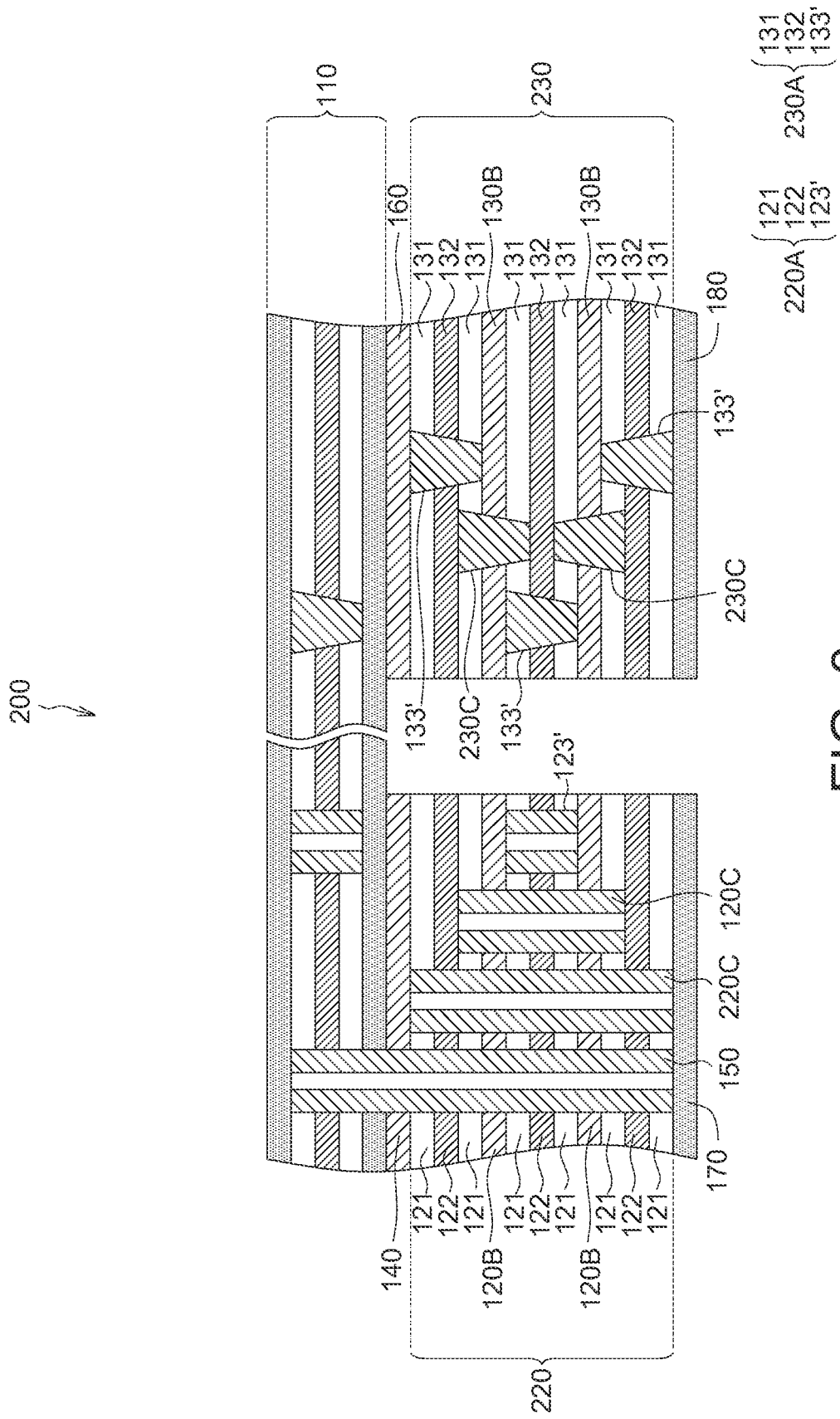
FIG. 3 shows a partial cross-sectional view of a circuit board module 200 according to another embodiment of the present invention.

Referring to FIG. 3, FIG. 3 shows a partial cross-sectional view of a circuit board module 200 according to another embodiment of the present invention. The circuit board module 200 includes the first circuit board 110, a second circuit board 220, a third circuit board 330, the first connection layer 140, at least one first connection hole 150 and the third connection layer 160. The circuit board module 200 could be applied to an electronic product, such as a lamp (for example, a street lamp, a traffic lamp, etc.), an automobile, a home appliance, a mobile phone, a notebook computer, etc., but not limited to the aforementioned devices. For a street lamp, one of the second circuit board 220 and the third circuit board 230 is, for example, a power supply board, a lamp board or a control board. The first circuit board 110 could connect the second circuit board 220 with the third circuit board 230 for electrically connecting the second circuit board 220 with the third circuit board 230.

As shown in FIG. 3, the second circuit board 220 includes at least one second circuit board assembly 220A, at least one second connection layer 120B, at least one second connection hole 120C and at least one second connection hole 220C. The second circuit board assembly 220A includes at least two second conductive layers 121, at least one second dielectric core layer 122 and at least one second conductive hole 123', wherein the second dielectric core layer 122 is formed between two adjacent second conductive layers 121 and connects two second conductive layers 121. The material, structure and/or manufacturing process of the second conductive hole 123' are similar to or the same as that of the aforementioned second conductive hole 123, and it will not be repeated here.

As shown in FIG. 3, the third circuit board 230 includes at least one third circuit board assembly 230A, at least one fourth connection layer 130B and at least one fourth connection hole 230C, wherein the third circuit board assembly 230A includes two third conductive layers 131, a third dielectric core layer 132 and at least one third conductive hole 133'. The third dielectric core layer 132 is formed between two third conductive layers 131, and the third conductive hole 133' connects two third conductive layers 131. The material, structure and/or manufacturing process of the third conductive hole 133' could be similar to or the same as that of the aforementioned laser via 113A, and it will not be repeated here.

The circuit board module 200 of the present embodiment includes technical features similar to or the same as that of the aforementioned circuit board module 100, the difference is that the second circuit board 220 of the circuit board module 200 further includes at least one second connection hole 220C, and the third circuit board 230 further includes at least one fourth connection hole 230C.

As shown in FIG. 3, in the second circuit board 220, the second connection hole 220C connects two second circuit board assembly 220A of the second circuit board 220. For example, the second connection hole 220C connects one of the two second conductive layers 121 of one of the second circuit board assemblies 220A with one of two second conductive layers 121 of another of the second circuit board assemblies 220A. The second connection hole 220C has the structure, material and/or manufacturing process similar to or the same as that of the second connection hole 120C, the difference is that the second connection hole 220C is different from the second connection hole 120C in length. For example, the second connection hole 220C is longer than the second connection hole 120C.

As shown in FIG. 3, in the third circuit board 230, the fourth connection hole 230C is connected to two third circuit board assemblies 230A of the third circuit board 230. For example, the fourth connection hole 230C connects one of two third conductive layers 131 of one of the third circuit board assemblies 230A with one of two third conductive layers 131 of another of the third circuit board assemblies 230A. The fourth connection hole 230C has the structure similar to or the same as that of the third conductive hole 133, and it will not be repeated here.

Although not shown, the circuit board module 200 could further include at least one third connection hole which connects the first circuit board 110 with the third circuit board 230. For example, the third connection hole connects one of two conductive layers 111 of the first circuit board 110 with one of two third conductive layers 131 of one third circuit board assembly 230A of the third circuit board 230. The aforementioned third connection hole has the structure similar to that of the aforementioned first connection hole 150, and it will not be repeated here.

Referring to FIGS. 4A to 4F, FIGS. 4A to 4F show manufacturing processes of the circuit board module 100 in FIG. 1.

Figure 4A:
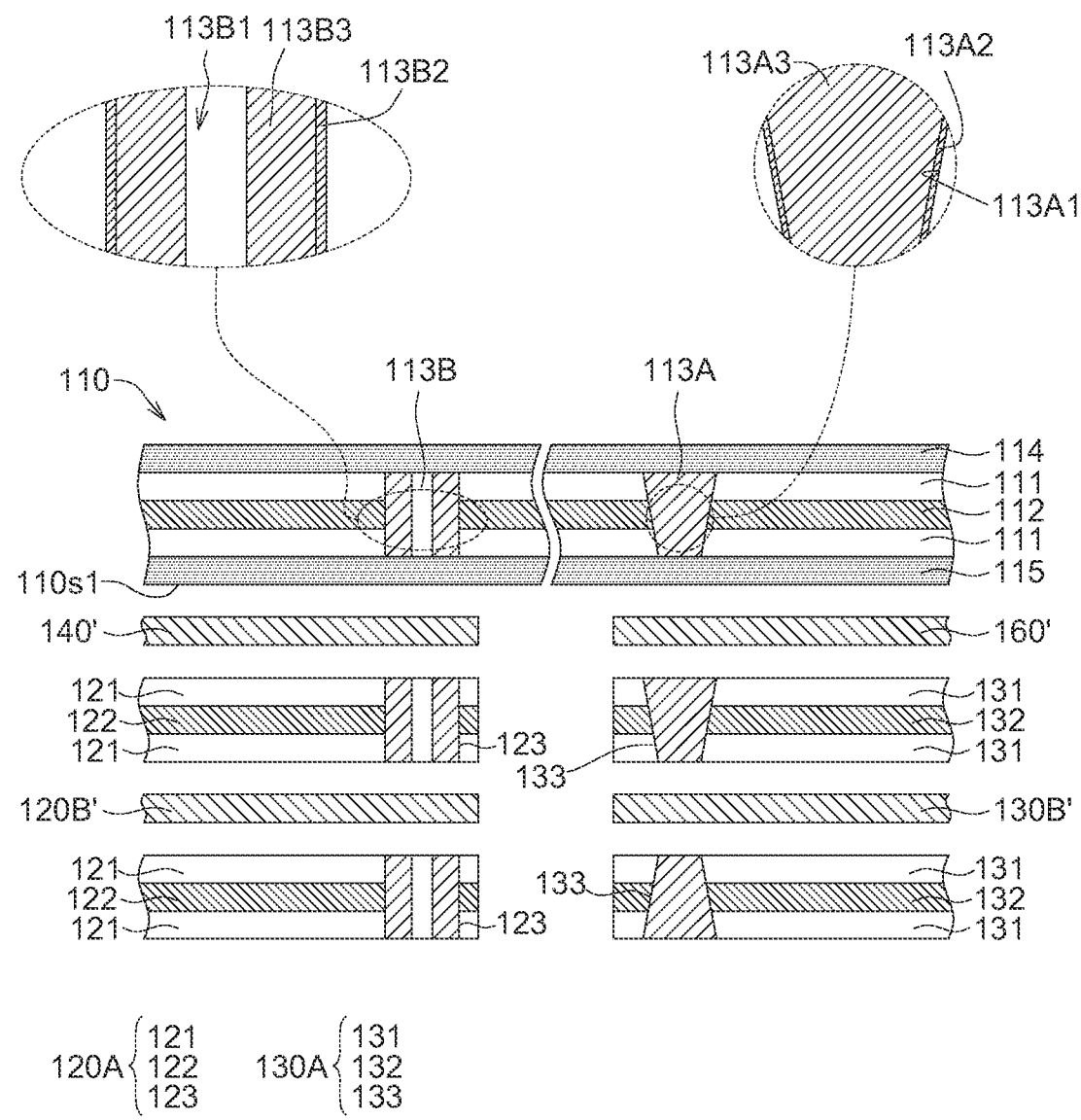
FIGS. 4A to 4F show manufacturing processes of the circuit board module in FIG. 1.

As shown in FIG. 4A, the first circuit board 110 is provided, wherein the first circuit board 110 includes two first conductive layers 111, at least one first dielectric core layer 112 and at least one first conductive hole (for example, the laser via 113A and the drilling via 113B), the first dielectric core layer 112 is formed between two first conductive layers 111, the laser via 113A and the drilling via 113B connect two first conductive layers 111. In addition, the first circuit board 110 further includes the first protection layer 114 and the second protection layer 115, wherein the first protection layer 114 and the second protection layer 115 are formed on two first conductive layers 111 respectively.

In an embodiment, the manufacturing process of the first circuit board 110 includes: firstly, a first prepreg dielectric core layer (not shown) is disposed between two first conductive layers 111. The "prepreg" herein is, for example, in the form of glue or glue layer, which is soft and flexible. Then, the first prepreg dielectric core layer and two first conductive layers 111 are pressed and heated by using a lamination method, wherein the first prepreg dielectric core layer is cured to form the first dielectric core layer 112 after being heated. After curing, the first dielectric core layer 112 and two first conductive layers 111 are tightly bound to each other. Then, at least one laser via 113A connecting two first conductive layers 111 is formed by laser drilling technology and/or at least one drilling via 113B connecting two first conductive layers 111 by using drilling technology. The manufacturing process of the laser via 113A includes, for example: the connection hole 113A1 is formed by laser drilling technology, then the electroless copper layer 113A2 covering an hole wall of the connection hole 113A1 is formed by electroless plating, and then the electroplated copper 113A3 on the electroless copper layer 113A2 is formed by using electroplating technology, wherein the electroplated copper 113A3 could fill up the connection hole 113A1. The manufacturing process of the drilling via 113B includes, for example: the connection hole 113B1 is formed by using mechanical drilling technology, then the electroless copper 113B2 covering on the hole wall of the connection hole 113B1 is formed by using electroless plating, and then the electroplated copper 113B3 on the electroless copper 113B2 is formed by electroplating technology, wherein the electroplated copper 113B3 could not fill the connection hole 113B1. Then, the first protection layer 114 on one of two first conductive layers 111 is formed by using a coating technique, and the second protection layer 115 on another of two first conductive layers 111 is formed by using the coating technique. So far, the first circuit board 110 is formed.

As shown in FIG. 4A, the second circuit board 120 is provided, wherein the second circuit board 120 includes at least one second circuit board assembly 120A, the second circuit board assembly 120A includes two second conductive layers 121, at least one second dielectric core layer 122 and at least one second conductive hole 123, the second dielectric core layer 122 is formed between two second conductive layers 121, and the second conductive hole 123 connects two second conductive layers 121. The number of the second circuit board assembly 120A in the present embodiment could be multiple or one. The manufacturing method of the second circuit board assembly 120A could be similar to or the same as that of the aforementioned first circuit board 110, and it will not be repeated here.

As shown in FIG. 4A, the third circuit board 130 is provided, wherein the third circuit board 130 includes at least one third circuit board assembly 130A, the third circuit board assembly 130A includes two third conductive layers 131, at least one third dielectric core layer 132 and at least one third conductive hole 133, the third dielectric core layer 132 is formed between two adjacent third conductive layers 131, and the third conductive hole 133 connects two third conductive layers 131. The number of the third circuit board assembly 130A in the present embodiment could be multiple or one. The manufacturing method of the third circuit board assembly 130A is similar to or the same as that of the aforementioned first circuit board 110, and it will not be repeated here.

As shown in FIG. 4A, a first prepreg connection layer 140' is disposed between the first circuit board 110 and the second circuit board assembly 120A, wherein all second circuit board assemblies 120A are disposed on the first surface 110s1 of the first circuit board assembly 120A, and a second prepreg connection layer 120B' could be disposed between two adjacent second circuit board assemblies 120A. In addition, the third prepreg connection layer 160' is disposed between the first circuit board 110 and the third circuit board assembly 130A, wherein all third circuit board assemblies 130A are disposed on the first surface 110s1 of the first circuit board 110, and the fourth prepreg connection layer 130B' could be disposed between two adjacent third circuit board assemblies 130A.

Figure 4B:
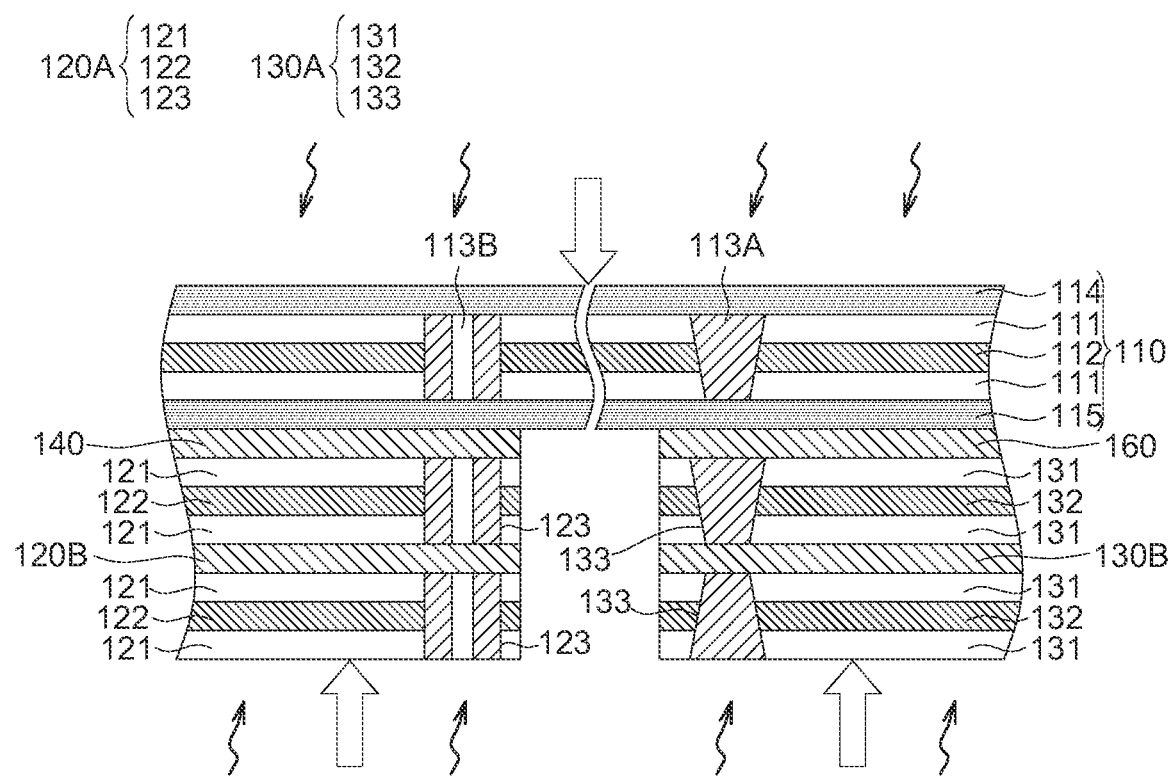

As shown in FIGS. 4A and 4B, the first circuit board 110, the first prepreg connection layer 140', the second prepreg connection layer 120B', the third prepreg connection layer 160', the fourth prepreg connection layer 130B', the second circuit board assembly 120A and the third circuit board assembly 130A are pressed and heated, wherein the first prepreg connection layer 140' is cured to form the first connection layer 140 after being heated, the second prepreg connection layer 120B' is cured to form the second connection layer 120B after being heated, the third prepreg connection layer 160' is cured to form the third connection layer 160 after being heated, and the fourth prepreg connection layer 130B' is cured to form the fourth connection layer 130B after being heated. After being cured, the first circuit board 110, the first connection layer 140, the second connection layer 120B, the third connection layer 160, the fourth connection layer 130B, the second circuit board assembly 120A and the third circuit board assembly 130A in FIG. 4B 130A are tightly combined to each other.

Figure 4C:
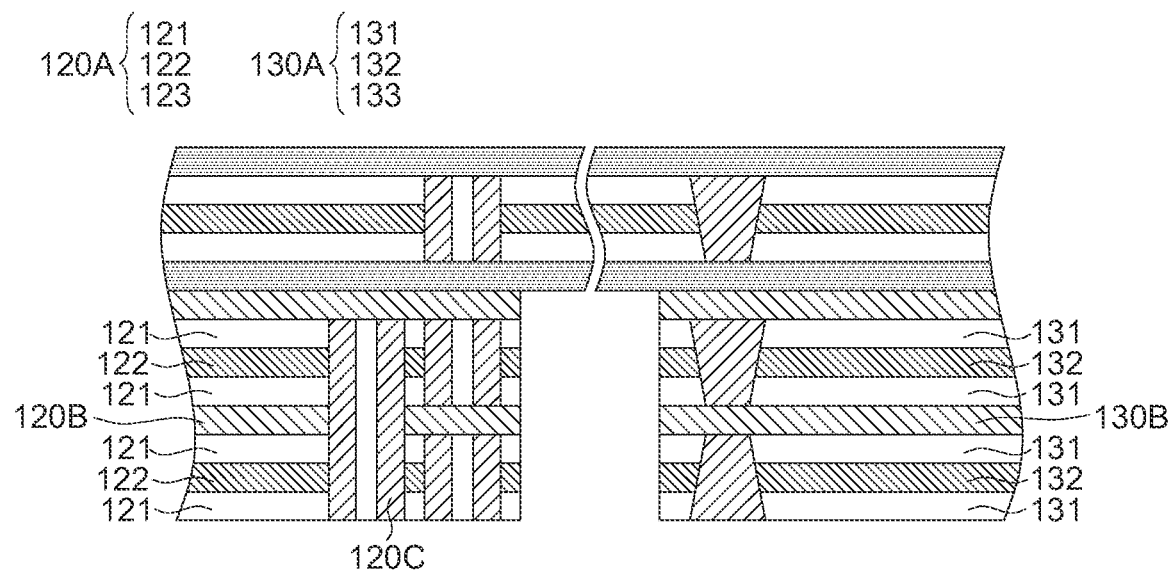

As shown in FIG. 4C, the second connection hole 120C connecting two second conductive layers 121 of two second circuit board assemblies 120A is formed. The forming process of the second connection hole 120C is the same as or similar to that of the aforementioned drilling via 113B, and it will not be repeated here. In another embodiment, the second connection hole 120C could have the structure similar to that of the aforementioned laser via 113A, the forming process of the second connection hole 120C is the same as or similar to that of the aforementioned laser via 113A, and it will not be repeated here. Although not shown, in another embodiment, the fourth connection hole connecting two second third conductive layers 131 of two second circuit board assemblies 130A is formed, wherein the forming process of the fourth connection hole is the same as or similar to that of the second connection hole 120C, and it will not be repeated here.

Figure 4D:
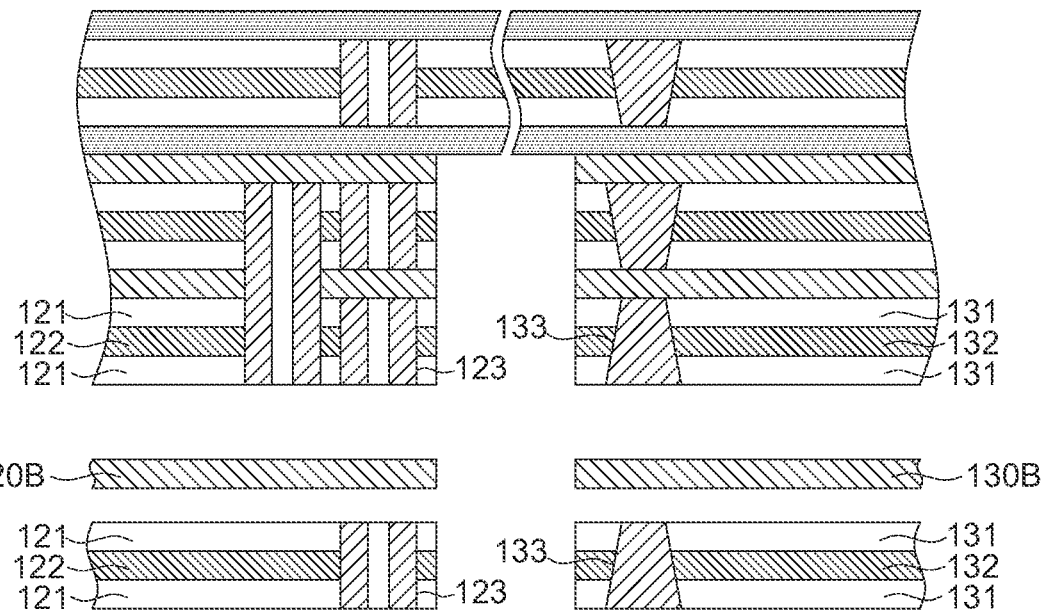

As shown in FIG. 4D, at least one second circuit board assembly 120A and at least one third circuit board assembly 130A are provided. Then, the second prepreg connection layer 120B' is disposed between two adjacent second circuit board assemblies 120A, and the fourth prepreg connection layer 130B' is disposed between two adjacent third circuit board assemblies 130A.

Figure 4E:
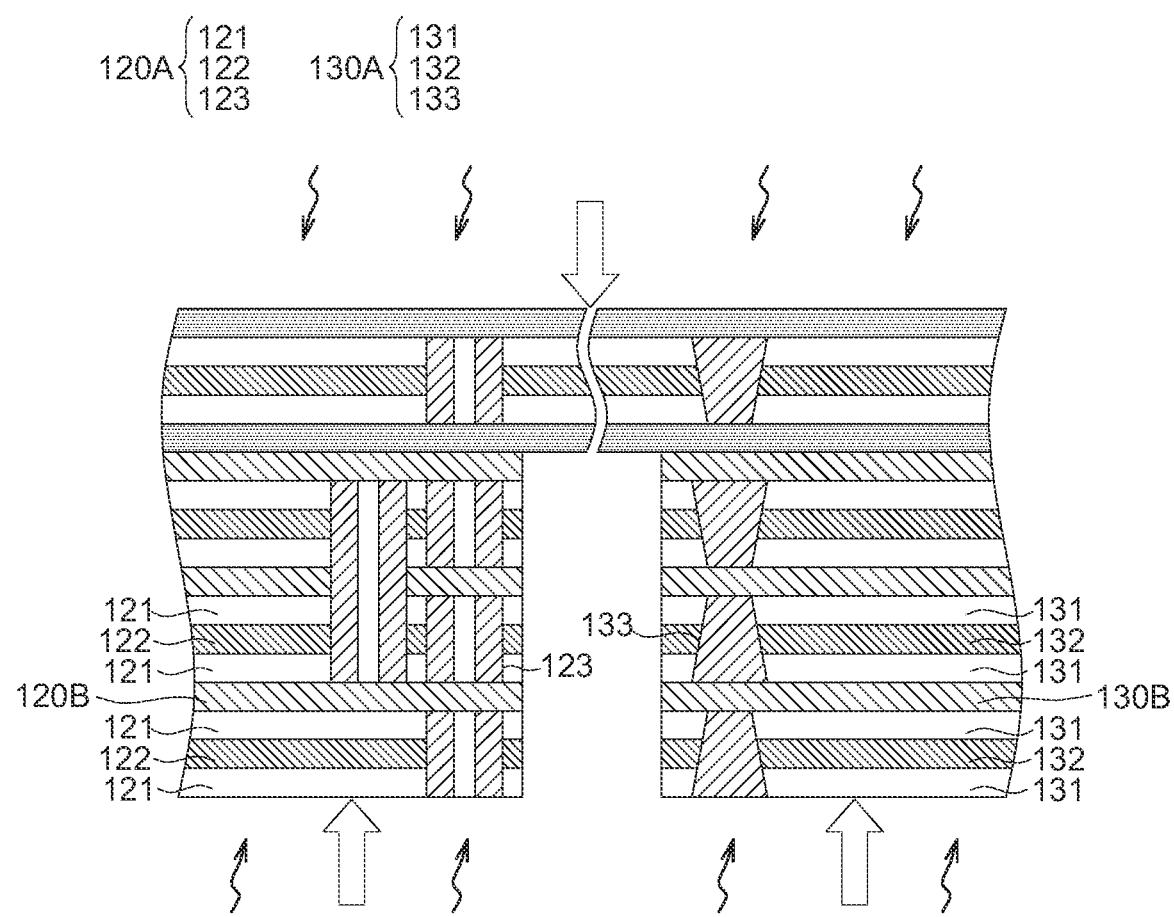

As shown in FIG. 4E, the second circuit board assemblies 120A, the third circuit board assemblies 130A, the second prepreg connection layer 120B' and the fourth prepreg connection layer 130B' are pressed and heated, wherein the second prepreg connection layer 120B' is cured to form the second connection layer 120B after being heated, and the fourth prepreg connection layer 130B' is cured to form the fourth connection layer 130B after being heated. After being cured, the second circuit board assemblies 120A, the third circuit board assemblies 130A, the second connection layer 120B and the fourth connection layer 130B in FIG. 4E are tightly combined to each other. So far, all second circuit board assemblies 120A and the second connection layer 120B therebetween form the second circuit board 120, and all third circuit board assemblies 130A and the fourth connection layer 130B therebetween form the third circuit board 130.

Figure 4F:
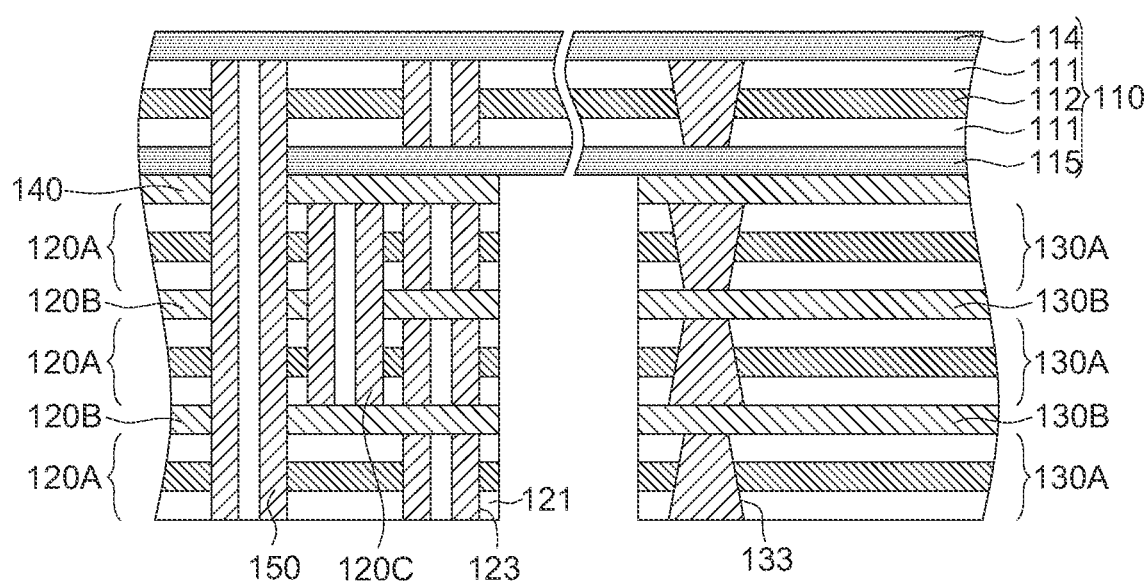

As shown in FIG. 4F, the first connection hole 150 connecting the first circuit board 110 with the second circuit board 120 is formed. For example, the first connection hole 150 connecting one of two first conductive layers 111 of the first circuit board 110 with one of two second conductive layers 121 of one second circuit board assembly 120A of the second circuit board 120. The forming process of the first connection hole 150 is the same as or similar to that of the aforementioned drilling via 113B, and it will not be repeated here. In another embodiment, the first connection hole 150 could have the structure similar to the aforementioned laser via 113A, the forming process of the first connection hole 150 is the same as or similar to that of the aforementioned laser via 113A, and it will not be repeated here. Although not shown, in another embodiment, the third connection hole connecting the first circuit board 110 with the third circuit board 130 is formed, wherein the forming process of the third connection hole is the same as or similar to that of the first connection hole 150, and it will not repeat them here.

Then, if there is no other second circuit board assembly 120A and third circuit board assembly 130A, the third protection layer 170 covering the outermost second circuit board assembly 120A and the fourth protection layer 180 covering the outermost third circuit board assembly 130A are formed by using the coating technique, as shown in FIG. 2.

In another embodiment, the second circuit board assembly 120A, the second connection layer 120B and the second connection hole 120C in FIG. 4C could be prefabricated and then together combined with the first circuit board 110. Similarly, the second third circuit board assembly 130A and the fourth connection layer 130B in FIG. 4C could be prefabricated and then together combined with the first circuit board 110. In other embodiment, all second circuit board assemblies 120A, the second connection layer 120B and the second connection holes 120C in FIG. 4F could be prefabricated and then together combined with the first circuit board 110. Similarly, all third circuit board assemblies 130A and the fourth connection layer 130B in FIG. 4F could be prefabricated and then together combined with the first circuit board 110.

The manufacturing process of the circuit board module 200 in FIG. 3 is similar to the aforementioned circuit board module 100, and it will not be repeated here.

To sum up, the embodiments of the present invention provide a circuit board module and a manufacturing method thereof. The circuit board module includes a first circuit board and a second circuit board, and the second circuit board could be entirely disposed on single side of the first circuit board. The circuit board module and its manufacturing method could produce at least the following technical effects: (1). a high-frequency signal could only be transmitted through the first circuit board (not through the second circuit board), and accordingly it could shorten the length of the transmission path of the high-frequency signal and reduce the loss of the high-frequency signal transmission (suitable for a high-frequency product); (2). due to transmission path of the high-frequency signal passes through a small number of conductive holes, it could reduce the complexity of impedance matching, reduce the stub effect and maintain signal integrity (suitable for a high-frequency product); (3). It could reduce the stock preparation for the high-frequency dielectric material and simplify material inventory management; (4). compared with a circuit board module whose the first circuit board is clamped between the second circuit board and the third circuit board, the expansion and contraction of the second circuit board and the third circuit board in the embodiment of the present invention are smaller; (5). compared with compared with a circuit board module whose the first circuit board is clamped between the second circuit board and the third circuit board, the curvature radius of the first circuit board in the embodiment of the present invention is larger at the bend of the first circuit board, and accordingly it could reduce the stress concentration at the bend.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit board module, comprising:
   a first circuit board comprising two first conductive layers, a first dielectric core layer and a first conductive hole, wherein the first dielectric core layer is formed between the two first conductive layers, and the first conductive hole connects the two first conductive layers;
   a second circuit board comprising two second conductive layers, a second dielectric core layer and a second conductive hole, wherein the second dielectric core layer is formed between the two second conductive layers, and the second conductive hole connects the two second conductive layers; and
   a first connection layer formed between the first circuit board and the second circuit board and combining the first circuit board with the second circuit board;
   wherein the second circuit board is disposed on a first surface of the first circuit board;
   wherein the circuit board further comprises:
   a third circuit board disposed on the first surface of the first circuit board and comprising two third conductive layers, a third dielectric core layer and a third conductive hole, wherein the third dielectric core layer is formed between two adjacent third conductive layers, and the third conductive hole connects the two third conductive layers; and
   a third connection layer formed between the first circuit board and the third circuit board and combining the first circuit board with the third circuit board.

2. The circuit board module as claimed in claim 1, wherein the first circuit board further comprises:
   a first protection layer formed on one of the two first conductive layers; and
   a second protection layer formed on another of the two first conductive layers.

3. The circuit board module as claimed in claim 1, wherein the two second conductive layers, the second dielectric core layer and the second conductive hole form a circuit board assembly.

4. The circuit board module as claimed in claim 1, further comprising:
   a first connection hole connecting one of the two first conductive layers of the first circuit board with one of the two second conductive layers of the second circuit board.

5. The circuit board module as claimed in claim 1, wherein the second circuit board comprises:
   a plurality of circuit board assemblies; and
   a second connection hole connecting two of the circuit board assemblies.

6. The circuit board module as claimed in claim 1, wherein the second circuit board comprises a plurality of circuit board assemblies, and the second circuit board further comprises:
   a plurality of second connection layers, wherein one of the second connection layers is formed between two adjacent circuit board assemblies and combining the two adjacent circuit board components.

7. The circuit board module as claimed in claim 1, wherein the two third conductive layers, the third dielectric core layer and the third conductive hole form a circuit board assembly.

8. The circuit board module as claimed in claim 1, wherein the third circuit board comprises a plurality of circuit board assemblies, and the second circuit board further comprises:
   a plurality of fourth connection layers, wherein one of the fourth connection layers is formed between two adjacent circuit board assemblies and combined the two adjacent circuit board assemblies.

9. The circuit board module as claimed in claim 1, further comprising:
   a third connection hole connecting one of the two first conductive layers of the first circuit board with one of the two third conductive layers of the third circuit board.

10. The circuit board module as claimed in claim 1, wherein
    the third circuit board comprises:
    a plurality of circuit board assemblies; and
    a fourth connection hole connecting two of the circuit board assemblies.

11. A manufacturing method for a circuit board module, further comprising:
    providing a first circuit board, wherein the first circuit board comprises two first conductive layers, a first dielectric core layer and a first conductive hole, the first dielectric core layer is formed between the two first conductive layers, and the first conductive hole connects the two first conductive layers;
    providing a second circuit board, wherein the second circuit board comprises two second conductive layers, a second dielectric core layer and a second conductive hole, the second dielectric core layer is formed between the two second conductive layers, and the second conductive hole connects the two second conductive layers;
    disposing a first prepreg connection layer between the first circuit board and the second circuit board, wherein the second circuit board is disposed on a first surface of the first circuit board; and
    pressing and heating the first circuit board, the first prepreg connection layer and the second circuit board to form the circuit board module, wherein the first prepreg connection layer is cured to form a first connection layer after being heated;
    wherein the manufacturing method further comprises:
    providing a third circuit board, wherein the third circuit board comprising two third conductive layers, a third dielectric core layer and a third conductive hole, the third dielectric core layer is formed between the two third conductive layers, and the third conductive hole connects the two third conductive layers;
    disposing a third prepreg connection layer between the first circuit board and the third circuit board, wherein the third circuit board is disposed on the first surface of the first circuit board; and pressing and heating the first circuit board, the third prepreg connection layer and the third circuit board to form the circuit board module, wherein the third prepreg connection layer is cured to form a third connection layer after being heated.

12. The manufacturing method as claimed in claim 11, wherein step of providing the first circuit board further comprises:
   disposing a first prepreg dielectric core layer between the two first conductive layers;
   pressing and heating the first prepreg dielectric core layer and the two first conductive layers to form the first circuit board, wherein the first prepreg dielectric core layer is cured to form a first dielectric core layer after being heated; and
   forming the first conductive hole to connect the two first conductive layers.

13. The manufacturing method as claimed in claim 12, wherein step of providing the first circuit board further comprises:
   forming a first protection layer on one of the two first conductive layers; and
   forming a second protection layer on another of the two first conductive layers.

14. The manufacturing method as claimed in claim 11, further comprising:
   forming a first connection hole to connect one of the two first conductive layers of the first circuit board with one of the two second conductive layers of the second circuit board.

15. The manufacturing method as claimed in claim 11, wherein the two second conductive layers, the second dielectric core layer and the second conductive hole form a circuit board assembly; the manufacturing method further comprises:
   providing a plurality of the circuit board assemblies;
   disposing a second prepreg connection layer between two adjacent circuit board assemblies; and
   pressing and heating the second prepreg connection layer and the circuit board assemblies to form the second circuit board, wherein the second prepreg connection layer is cured to form a second connection layer after being heated.

16. The manufacturing method as claimed in claim 15, further comprising:
   forming a second connection hole to connect two of the circuit board assemblies.

17. The manufacturing method as claimed in claim 11, further comprising:
   forming a third connection hole to connect one of the two first conductive layers of the first circuit board with one of the two third conductive layers of the third circuit board.

18. The manufacturing method as claimed in claim 11, wherein the two third conductive layers, the third dielectric core layer and the third conductive hole form a circuit board assembly; the manufacturing method further comprises:
   providing a plurality of the circuit board assemblies;
   disposing a fourth prepreg connection layer between two adjacent circuit board assemblies; and
   pressing and heating the fourth prepreg connection layer and the circuit board assemblies to form the third circuit board, wherein the fourth prepreg connection layer is cured to form a fourth connection layer after being heated.

19. The manufacturing method as claimed in claim 18, further comprising:
   forming a fourth connection hole to connect two of the circuit board assemblies.

20. A circuit board module, comprising:
   a first circuit board comprising two first conductive layers, a first dielectric core layer and a first conductive hole, wherein the first dielectric core layer is formed between the two first conductive layers, and the first conductive hole connects the two first conductive layers;
   a second circuit board comprising two second conductive layers, a second dielectric core layer and a second conductive hole, wherein the second dielectric core layer is formed between the two second conductive layers, and the second conductive hole connects the two second conductive layers; and
   a first connection layer formed between the first circuit board and the second circuit board and combining the first circuit board with the second circuit board;
   wherein the second circuit board is disposed on a first surface of the first circuit board;
   wherein the circuit board module further comprises a third circuit board, and the second circuit board and the third circuit board both are disposed on the first surface of the first circuit board.

* * * * *